United States Patent
Kim

(10) Patent No.: US 7,312,504 B2
(45) Date of Patent: Dec. 25, 2007

(54) TRANSISTOR FOR MEMORY DEVICE AND METHOD FOR MANUFACTURING THE SAME

(75) Inventor: Hyun Jung Kim, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 11/173,694

(22) Filed: Jul. 1, 2005

(65) Prior Publication Data

US 2006/0273415 A1    Dec. 7, 2006

(30) Foreign Application Priority Data

Jun. 1, 2005    (KR) .................... 10-2005-0046845

(51) Int. Cl.
*H01L 29/76*    (2006.01)
*H01L 21/336*    (2006.01)

(52) U.S. Cl. ............... 257/413; 257/401; 257/412; 257/E21.442; 257/E21.703; 257/E29.275; 257/E29.279; 438/585

(58) Field of Classification Search .......... 247/401, 247/411–413; 438/284, 585
See application file for complete search history.

(56) References Cited

U.S. PATENT DOCUMENTS

| | | | |
|---|---|---|---|
| 4,979,014 A * | 12/1990 | Hieda et al. | 257/394 |
| 7,166,514 B2 * | 1/2007 | Kang et al. | 438/296 |
| 2005/0121703 A1 * | 6/2005 | Hieda et al. | 257/288 |
| 2005/0269629 A1 * | 12/2005 | Lee et al. | 257/327 |

* cited by examiner

*Primary Examiner*—A. Sefer
(74) *Attorney, Agent, or Firm*—Ladas & Parry LLP

(57) ABSTRACT

Disclosed is a transistor for a memory device realizing both a step-gated asymmetry transistor and a fin transistor in a cell and a method for manufacturing the same. The transistor has an active region protruding from a predetermined region of a substrate and a groove formed in the active region. A field oxide layer is formed on the substrate around the active region in such a manner that it has a surface lower than the upper surface of the active region including the groove. A pair of gates are placed along one and the other ends of groove across the upper surface of the active region while overlapping the stepped portion of the active region. The transistor has the structure of a step-gated asymmetry transistor when seen in a sectional view taken in a first direction, as well as that of a fin transistor when seen in a sectional view taken in a second direction, which is perpendicular to the first direction. The transistor having such a structure can secure improved data retention time of the step-gated asymmetry transistor and excellent current driving properties of the fin transistor and is applicable not only to a logic device, but also to a memory device (for example, DRAM) requiring low-power and high-speed properties.

8 Claims, 5 Drawing Sheets

TRANSISTOR FOR MEMORY DEVICE AND METHOD FOR MANUFACTURING THE SAME

BACKGROUND OF THE INVENTION

1. Field of the invention

The present invention relates to a memory device and a method for manufacturing the same, and more particularly to a new type of transistor realizing both a fin transistor and a step-gated asymmetry transistor in a unit cell and a method for manufacturing the same.

2. Description of the Prior Art

As semiconductor devices are highly integrated, the design rule of high-integration MOSFET devices is drastically reduced to sub-100 nm level and the corresponding channel length and width of transistors are remarkably decreased. Due to the current trend towards a short channel structure, the threshold voltage cannot be independent of the channel width any longer. Therefore, it is generally accepted that, when realizing the target threshold voltage of a transistor requested in a specific device, the conventional two-dimensional planar structure has reached its limit.

In order to overcome this problem, three-dimensional transistors are actively studied these days in logic devices. In particular, fin transistors having triple channels are considered as the core technology requested in the next-generation logic devices. The fin transistors are designed to have channels formed on three surfaces by realizing an active having a three-dimensional structure, so that they have excellent current driving properties as the amount of current increases instantly. In addition, they have very excellent on-off properties and can realize high-speed devices. Due to decreased back bias dependency, they can have desired device properties in low voltage. For these properties, highly-integrated circuits can be realized.

However, three-dimensionally structured transistors have a problem in that they cannot secure enough data retention time, which is the most important property cells must have. This is because the source of junction leakage current is expected to become much bigger due to the triple channels formed in the narrow active region. Therefore, it is requested to secure enough data retention time when a transistor having such a structure is used in a memory device (for example, DRAM).

In summary, although conventional fin transistors have excellent on-off properties and high driving current properties and the possibility of using them as logic devices is actively studied, they are not yet applicable to memory devices due to poor data retention time.

SUMMARY OF THE INVENTION

Accordingly, the present invention has been made to solve the above-mentioned problems occurring in the prior art, and an object of the present invention is to provide a transistor for a memory device realizing both a step-gated asymmetry transistor and a fin transistor in a unit cell to secure improved data retention time of the step-gated asymmetry transistor and excellent current drivability of the fin transistor.

Another object of the present invention is to provide a transistor for a memory device applicable to memory devices requiring low-power and high-speed properties.

Still another object of the present invention is to provide a method for effectively manufacturing a transistor as mentioned above.

In order to accomplish these objects, there is provided a transistor for a memory device including an active region protruding from a predetermined region of a semiconductor substrate; a groove formed in the active region; a field oxide layer formed on the substrate outside the active region in such a manner that it has a surface lower than the upper surface of the active region; and a pair of gates formed along one and the other ends of the groove across the upper surface of the active region while overlapping the stepped portion of the active region.

According to another aspect of the present invention, there is provided a method for manufacturing a transistor for a memory device including the steps of etching a semiconductor substrate to form a protruding active region; forming a field oxide layer on the substrate region outside the active region; forming a groove in the active region; etching the field oxide layer in such a manner that it has a surface lower than the bottom surface of the groove and expose the upper surface of the active region including the groove; forming a gate insulation layer on the exposed upper surface of the active region including the groove; forming a gate conductive layer on the gate insulation layer; and etching the gate conductive layer and the gate insulation layer to form gates on one and the other ends of the groove, respectively, across the upper surface of the active region while overlapping the stepped portion of the active region.

Preferably, the groove has a thickness of 200-700 Å.

Preferably, the field oxide layer has a thickness of 2,000-4,000 Å and is etched in such a manner that it retains a thickness of 400-1500 Å.

Preferably, the gate insulation layer has a thickness of 30-50 Å.

Preferably, the gate conductive layer has a single-layered structure including a polysilicon material or a lamination structure including a first conductive layer made of a polysilicon material and a second conductive layer formed thereon and made of a low-resistance material. The second conductive layer is preferably made of any one chosen from a group comprising W, WN, WSix, and TiSix. When the gates have a lamination structure, the first and second conductive layers preferably have a thickness of 400-700 Å and 1,000-1,500 Å, respectively.

A transistor constructed as above realizes both a step-gated asymmetry transistor and a fin transistor in a unit cell and has the advantages of both. Therefore, it is applicable not only to a logic device, but also to a memory device such as a DRAM.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Figure 1:
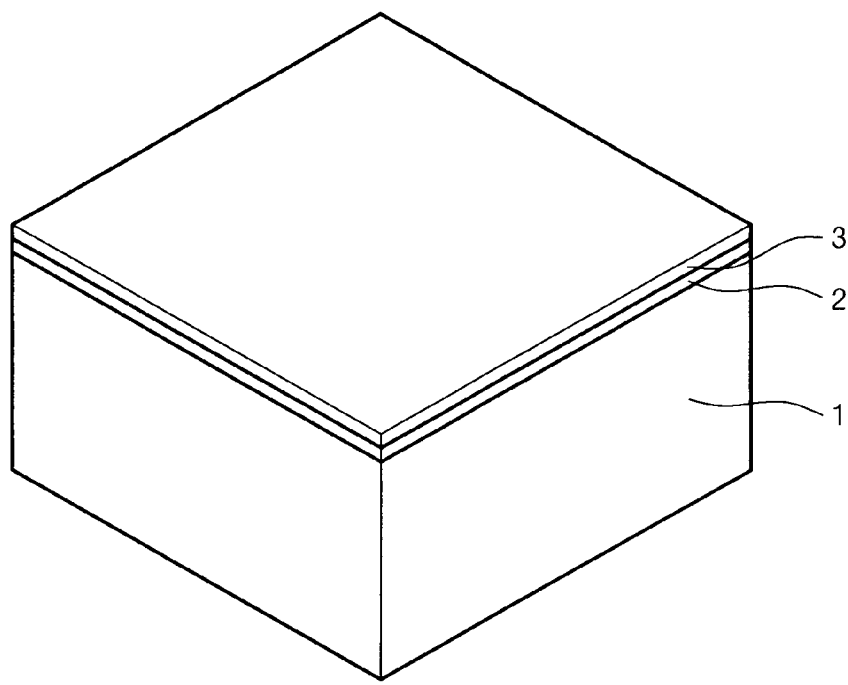
FIGS. 1 to 7 are perspective views showing the respective processes of a method for manufacturing a transistor for a memory device according to the present invention.

Hereinafter, a preferred embodiment of the present invention will be described with reference to the accompanying drawings. In the following description and drawings, the same reference numerals are used to designate the same or similar components, and so repetition of the description on the same or similar components will be omitted.

A method for manufacturing a transistor for a memory device according to the present invention will now be described with reference to FIGS. 1 to 7, which show the respective processes thereof.

Referring to FIG. 1, a pad oxide layer 2 and a pad nitride layer 3 are successively formed on a semiconductor substrate 1 with a thickness of 50-150 Å and 500-800 Å, respectively.

Figure 2:
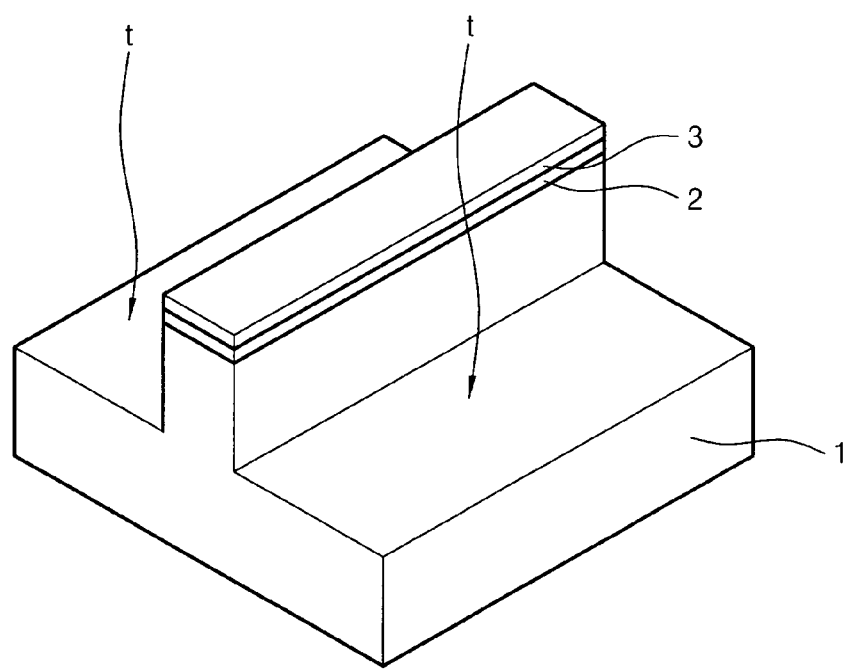

Referring to FIG. 2, trenches t are formed by etching the pad nitride layer 3, the pad oxide layer 2, and the substrate 1 to a predetermined depth with a mask delimiting portions on which trenches are to be formed. As a result, an active region 1a protruding vertically from the substrate 1 is defined.

Figure 3:
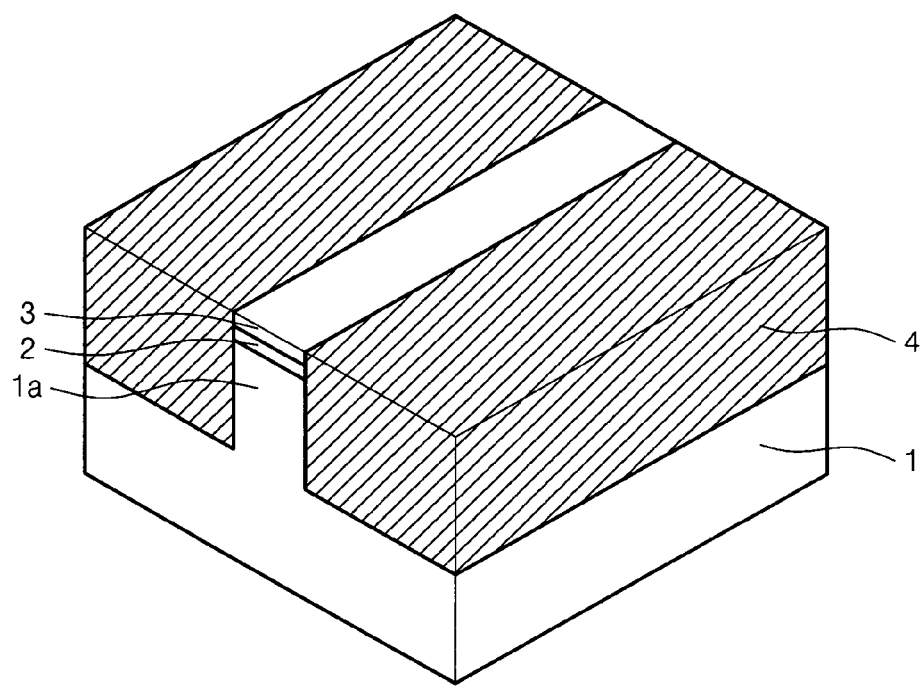

Referring to FIG. 3, an oxide layer is formed on the substrate 1 in a HDP (high density plasma) deposition process in such a manner that the trenches t are fully filled. The oxide layer is subjected to CMP to form a field oxide layer 4 in the trenches a. The field oxide layer 4 preferably has a thickness of 2,000-4,000 Å.

Figure 4:
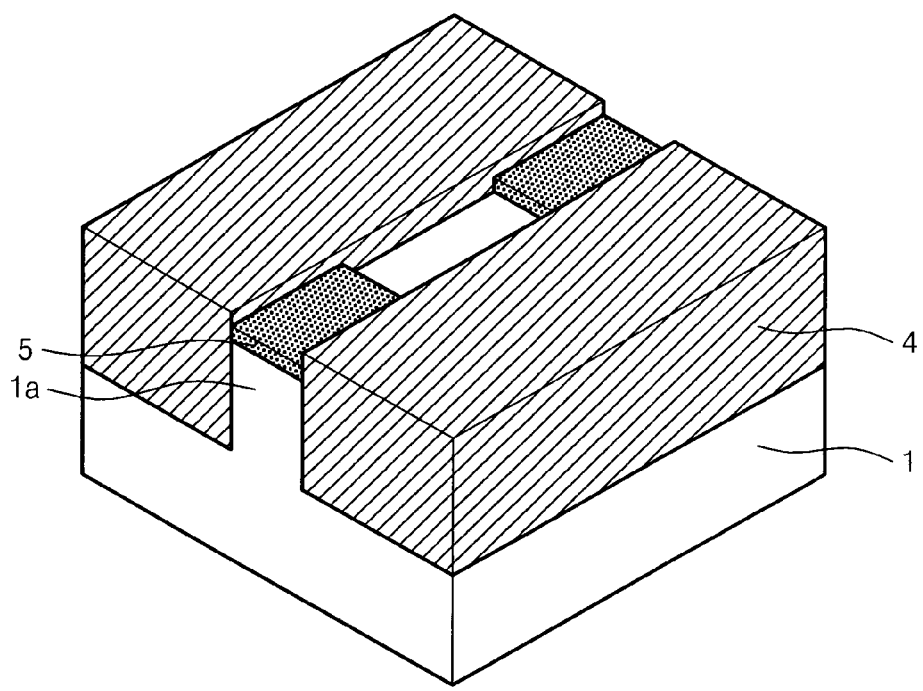

Referring to FIG. 4, the remaining pad nitride layer 3 and the pad oxide layer 2 are successively removed to expose the upper surface of the active region 1a. An oxide layer 5 is formed on the exposed upper surface of the active region 1a in such a manner that it has an opening in a region to be recessed.

Figure 5:
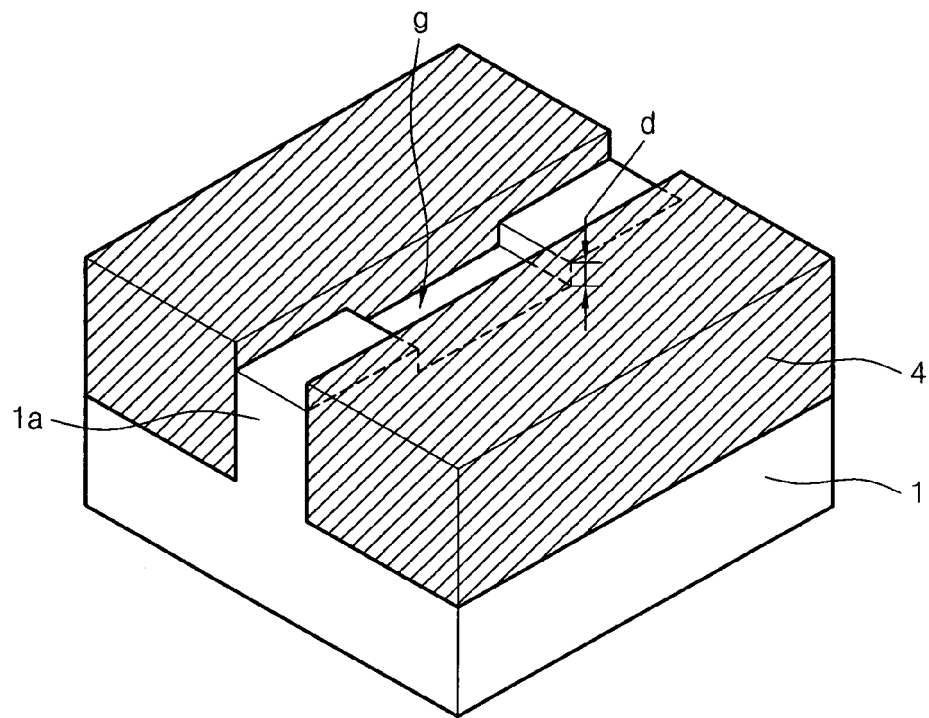

Referring to FIG. 5, the substrate 1 is etched to a predetermined depth using the oxide layer 5 as a hard mask. As a result, a groove g is formed in the active region 1a as shown. The groove preferably has a depth d of 200-700 Å. The oxide layer 5 used as a hard mask is removed.

Figure 6:
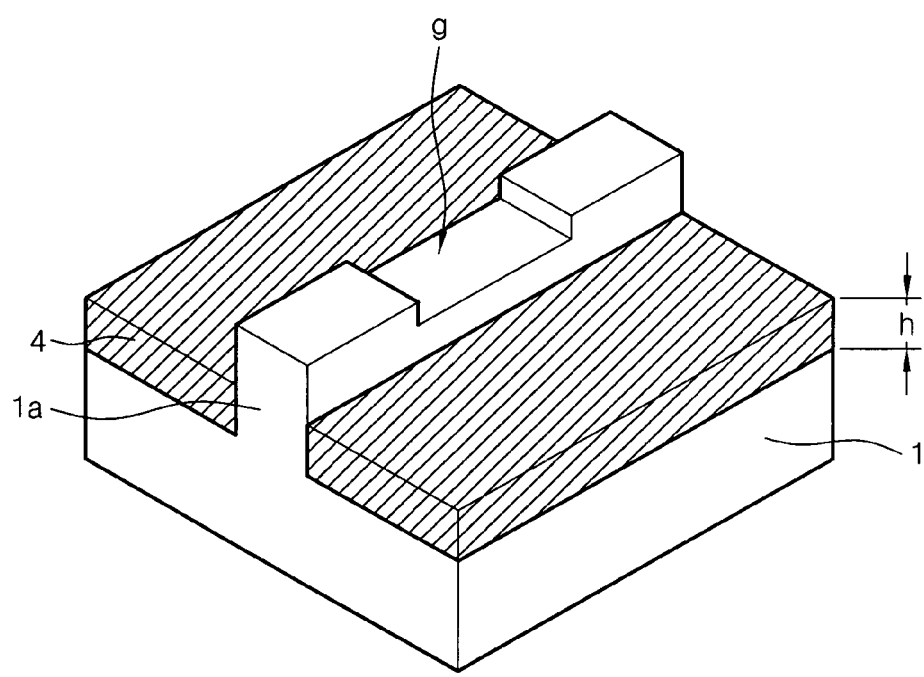

Referring to FIG. 6, the field oxide layer 4 is etched to a predetermined depth in a wet or dry etching process to expose the upper surface of the active region 1a including the groove g in such a manner that the remaining field oxide layer 4 has a surface lower than the bottom surface of the groove g. Preferably, the remaining thickness h of the field oxide layer 4 is 400-1500 Å.

Figure 7:
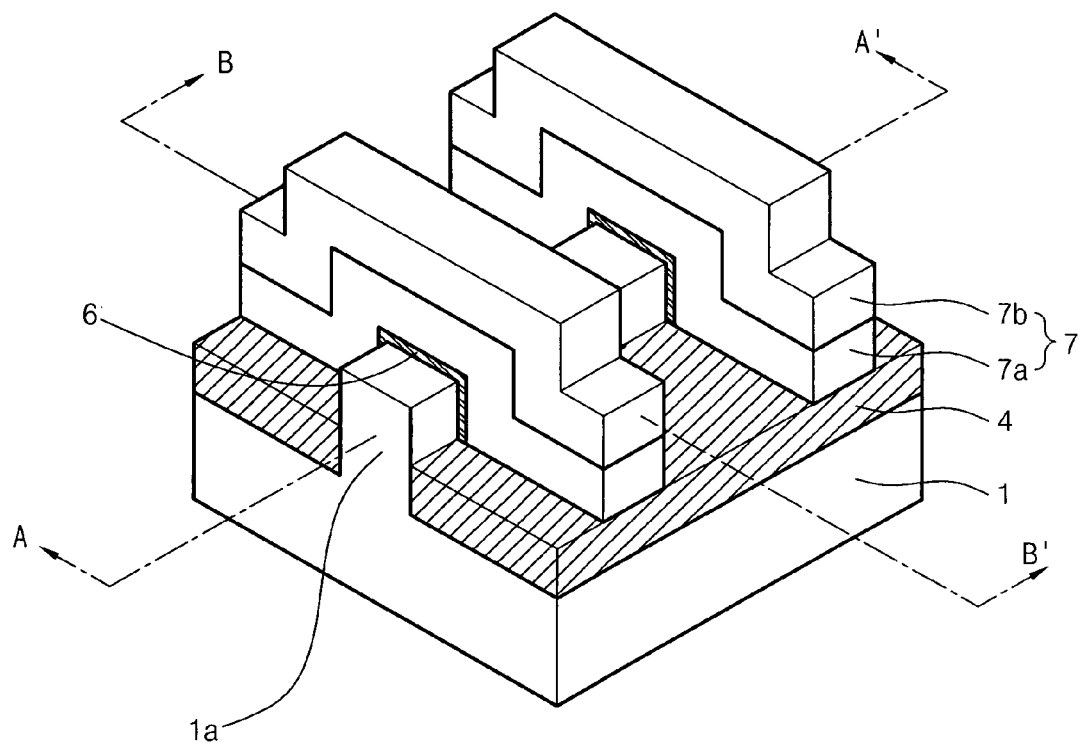

Referring to FIG. 7, well and channel regions are formed in a conventional ion injection process and a gate insulation layer 6 is formed along the upper surface of the active region 1a including the groove g with a thickness of 30-50 Å. First and second conductive layers 7a and 7b are successively formed on the gate insulation layer 6 and the field oxide layer 4 with a polysilicon material and a low-resistance material, respectively. The first and second conductive layers 7a and 7b have a thickness of 400-700 Å and 1000-1500 Å, respectively. The second conductive layer 7b is made of W, WN, WSix, or TiSix. The first and second conductive layers 7a and 7b are successively etched with a mask delimiting portions on which gates are to be formed. As a result, a pair of gates 7 are formed across the upper surface of the active region 1a while overlapping the stepped portion of the active region 1a along one and the other ends of the groove g.

It is obvious to those skilled in the art that, although the gates 7 have a lamination structure including first and second conductive layers 7a and 7b laminated on each other in this case, they may have a single-layered structure including a first conductive layer 7a made of a polysilicon.

Figure 8:
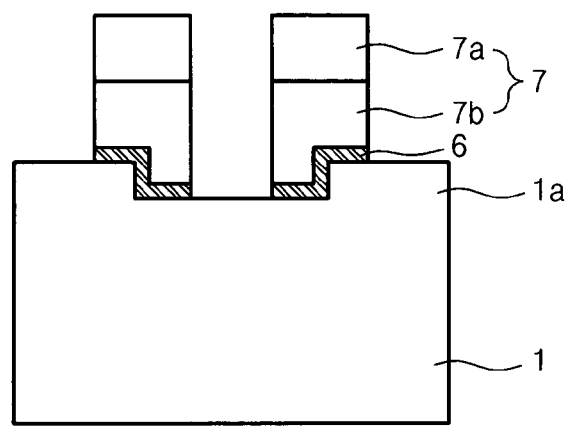
FIG. 8 is a sectional view taken along line A-A' of FIG. 7.
Figure 9:
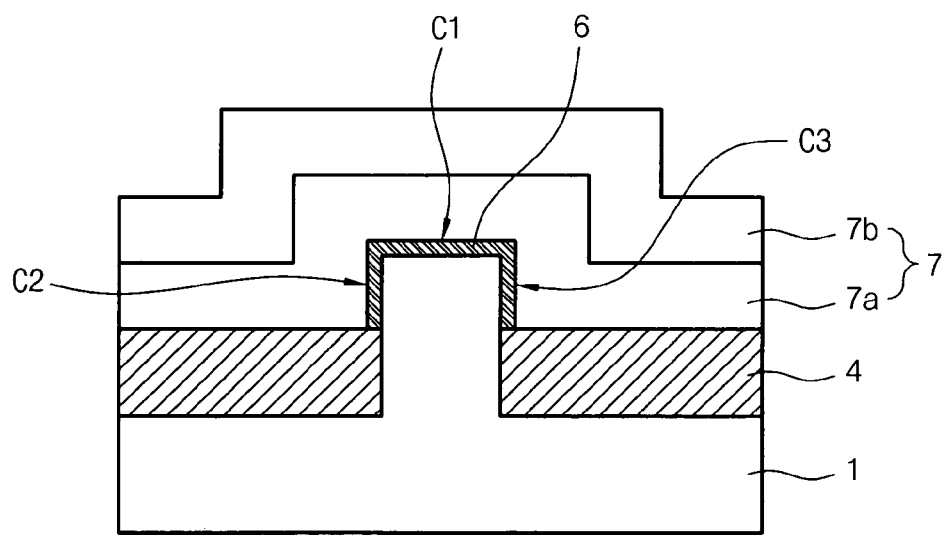
FIG. 9 is a sectional view taken along line B-B' of FIG. 7.

FIGS. 8 and 9 show the structure of a transistor for a memory device completed through the processes shown in FIGS. 1 to 7. FIG. 8 is a sectional view taken along line A-A' of FIG. 7 and FIG. 9 is another section view taken along line B-B' thereof.

Referring to the sectional views, the transistor proposed in the present invention includes an active region 1a protruding from a predetermined region of a semiconductor substrate 1; a groove g formed in the active region 1a with a predetermined depth; a field oxide layer 4 formed on the substrate 1 around the active region 1a in such a manner that it has a surface lower than the upper surface of the active region 1a including the groove g; a pair of gates 7 formed on the field oxide layer 4 along one and the other ends of the groove g across the upper surface of the active region 1a while overlapping the stepped portion of the active region 1a; and a gate insulation layer 6 interposed between the gate electrode 7 and the active region 1a.

The transistor has the structure of a step-gated asymmetry transistor, as seen in the sectional view taken in the first direction (A-A'), as well as that of a fin transistor using three surfaces (portions labeled C1, C2, and C3) as channels, as seen in the sectional view taken in the second direction (B-B') which is perpendicular to the first direction. As such, the step-gated transistor and fin transistor are realized in a single transistor.

A transistor designed as above can utilize the advantages of both a step-gated asymmetry transistor and a fin transistor, when driving the device, and secure enough data retention time and excellent driving drivability.

As a result, fin transistors which have been limitedly applied to logic devices due to poor data retention time can be used in nano-scale memory devices requiring low-power and high-speed properties.

As mentioned above, the present invention realizes both a step-gated asymmetry transistor and a fin transistor in a unit transistor and, when driving the device, secures improved data retention time of the step-gated asymmetry transistor and excellent current drivability of the fin transistor. Therefore, the inventive transistor is applicable not only to a logic device, but also to a memory device (for example, DRAM) requiring low-power and high-speed properties.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A transistor for a memory device comprising:
   an active region protruding upwardly from and between two horizontal surfaces of a predetermined region of a semiconductor substrate, that remain after the semiconductor substrate is etched to form the upwardly protruding active region, the two horizontal surfaces being formed by selectively etching away semiconductor substrate material on at least two opposing sides of the active region to form a single, upwardly protruding semiconductor material structure, which extends above and between said two horizontal surfaces of semiconductor material, the upwardly protruding active region having an upper surface;
   a field oxide layer formed on the two horizontal surfaces of semiconductor substrate, that remain after being etched away to define the active region in such a manner that the field oxide layers on each of the horizontal surfaces is not on the upper surface of the active region but have an upper surface lower than the upper surface of the active region;

a gate insulation layer, formed over the upper surface of the upwardly protruding active layer and filling a groove having a depth and that is formed across the upper surface of the upwardly protruding active region's upper surface, the groove being formed after the step of etching the semiconductor substrate; and a pair of gates formed from material deposited over the field oxide layer on each side of the active region and over the gate insulation layer filling the groove, the pair of gates being spaced apart and separated from each other across the upper surface of the active region while overlapping the active region.

2. The transistor for a memory device as claimed in claim 1, wherein the material deposited into the groove has a thickness of 200-700 Å.

3. The transistor for a memory device as claimed in claim 1, wherein the field oxide layer has a thickness of 400-1,500 Å.

4. The transistor for a memory device as claimed in claim 1 wherein the gates have a lamination structure comprising a gate insulation layer and a gate conductive layer.

5. The transistor for a memory device as claimed in claim 4, wherein the gate insulation layer has a thickness of 30-50 Å.

6. The transistor for a memory device as claimed in claim 4, wherein the gate conductive layer has a single-layered structure comprising a polysilicon material or a lamination structure comprising a first conductive layer made of a polysilicon material and a second conductive layer formed thereon and made of a low-resistance material.

7. The transistor for a memory device as claimed in claim 6, wherein the second conductive layer is made of any one chosen from a group comprising W, WN, WSix, and TiSix.

8. The transistor for a memory device as claimed in claim 6, wherein, when the gates have a lamination structure, the first and second conductive layers have a thickness of 400-700 Å and 1,000-1,500 Å, respectively.

* * * * *